US010146451B2

(12) United States Patent
Liu

(10) Patent No.: US 10,146,451 B2
(45) Date of Patent: Dec. 4, 2018

(54) REDUCING READ DISTURB IN DATA STORAGE

(71) Applicant: SK Hynix Inc., Gyeonggi-do (KR)

(72) Inventor: Tao Liu, Milpitas, CA (US)

(73) Assignee: SK Hynix Inc., Gyeonggi-do (KR)

( * ) Notice: Subject to any disclaimer, the term of this patent is extended or adjusted under 35 U.S.C. 154(b) by 233 days.

(21) Appl. No.: 15/092,140

(22) Filed: Apr. 6, 2016

(65) Prior Publication Data

US 2017/0168740 A1 Jun. 15, 2017

Related U.S. Application Data

(60) Provisional application No. 62/265,589, filed on Dec. 10, 2015.

(51) Int. Cl.
*G06F 12/00* (2006.01)
*G06F 3/06* (2006.01)

(52) U.S. Cl.
CPC .......... *G06F 3/0619* (2013.01); *G06F 3/0659* (2013.01); *G06F 3/0661* (2013.01); *G06F 3/0679* (2013.01); *G06F 12/00* (2013.01)

(58) Field of Classification Search
CPC ...................................................... G06F 12/00

USPC ......................................................... 711/103
See application file for complete search history.

(56) References Cited

U.S. PATENT DOCUMENTS

| | | | |
|---|---|---|---|
| 5,815,438 A | 9/1998 | Haddad | |
| 6,240,016 B1 | 5/2001 | Haddad | |
| 6,660,585 B1 | 12/2003 | Lee | |
| 7,193,901 B2 | 3/2007 | Ruby | |
| 7,349,258 B2 | 3/2008 | Fong | |
| 7,778,078 B2 | 8/2010 | Nagadomi | |
| 8,001,441 B2 * | 8/2011 | Brandman | G06F 11/1068 714/763 |
| 2005/0013343 A1 * | 1/2005 | Giunco | H03L 7/087 375/130 |
| 2014/0247663 A1 | 9/2014 | Yuan | |
| 2017/0090785 A1 * | 3/2017 | Kashyap | G06F 3/0619 |

\* cited by examiner

*Primary Examiner* — Gautam Sain
(74) *Attorney, Agent, or Firm* — Kilpatrick Townsend & Stockton LLP

(57) ABSTRACT

A memory controller includes a data modulator and a data demodulator. The data modulator is configured to translate original data into modified data according to a conversion operation and write the modified data to the array of memory locations. The modified data generated by the conversion operation reduces a likelihood of the original data suffering a read disturb in the array of memory locations.

14 Claims, 9 Drawing Sheets

REDUCING READ DISTURB IN DATA STORAGE

CROSS-REFERENCES TO RELATED APPLICATIONS

This application is a non-provisional application and claims the benefit and priority of U.S. Provisional Application No. 62/265,589, filed on Dec. 10, 2015, titled "DATA STORAGE MODULE WITH DATA MODULATOR TO REDUCE READ DISTURB," which is herein incorporated by reference in its entirety for all purposes.

BACKGROUND OF THE INVENTION

Non-volatile memory systems such as Solid State Drives (SSDs) are finding new applications in consumer electronics. For example, they are replacing Hard Disk Drives (HDDs), which typically comprise rapidly rotating disks (platters). Non-volatile memories, sometimes referred to as 'flash memories' (for example, NAND and NOR flash devices), are used in media storage, cameras, mobile phones, mobile computers, laptop computers, USB flash drives, etc. Non-volatile memory provides a relatively reliable, compact, cost-effective, and easily accessible method of storing data when the power is off.

NAND flash memory systems include single level cell (SLC) architectures, multi-level cell (MLC) architectures, and tri-level cells (TLC). SLC architectures have two states per memory cell, MLC architectures have four states per memory cell, and TLC architectures have eight states per memory cell. With more levels for each cell, the margin between each state becomes smaller.

BRIEF DESCRIPTION OF THE DRAWINGS

Various embodiments in accordance with the present disclosure will be described with reference to the drawings, in which.

DETAILED DESCRIPTION OF THE INVENTION

Figure 1:
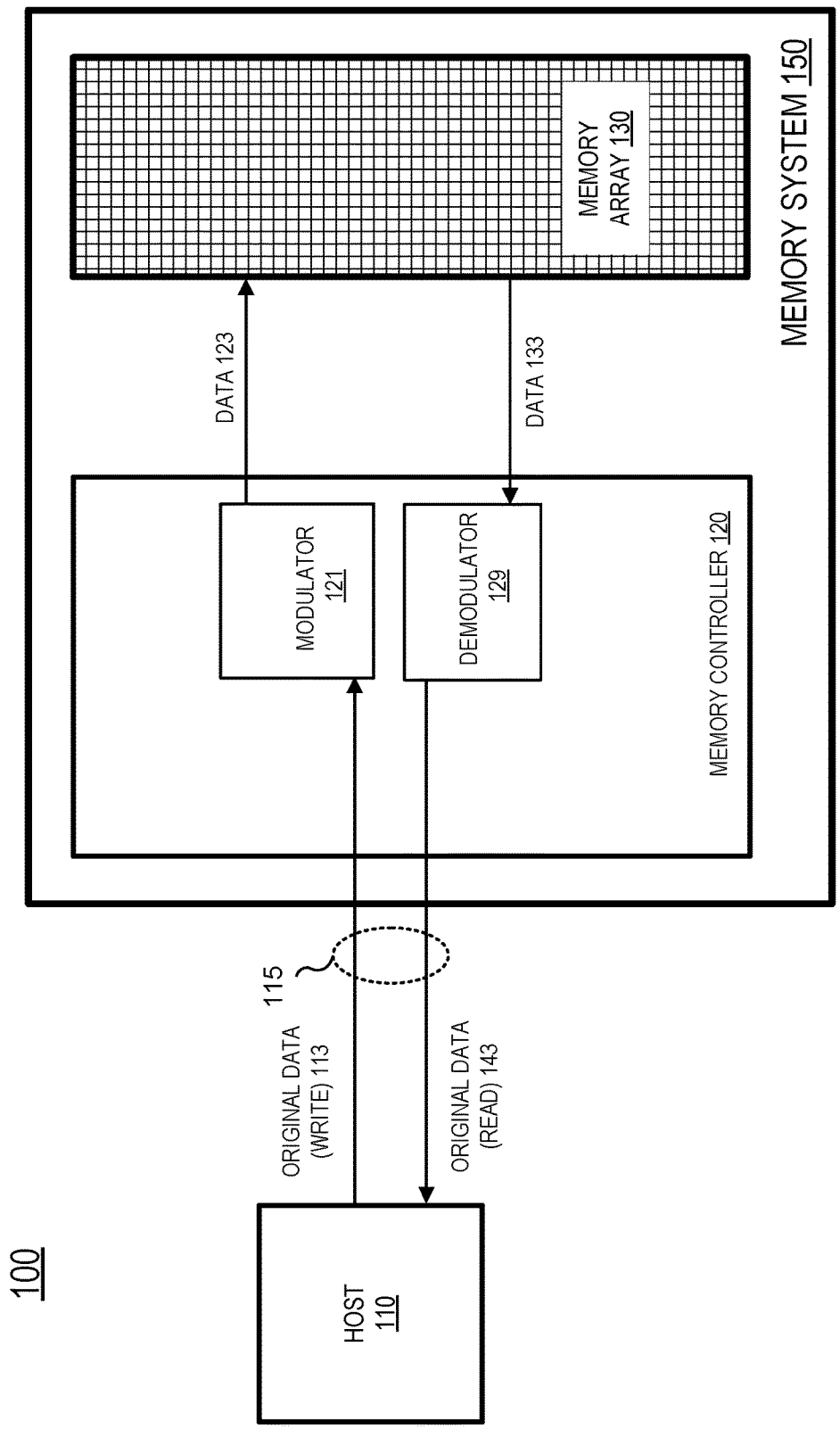
FIG. 1 illustrates an example top-level block diagram of a computing system including a host, memory controller, and memory array.

Embodiments of the invention pertain to methods, systems, and devices for reducing read disturb in memory cells. Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments. However, it will be apparent that various embodiments may be practiced without these specific details. The figures and description are not intended to be restrictive.

The ensuing description provides examples, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

The following detailed description together with the accompanying drawings in which the same reference numerals are sometimes used in multiple figures to designate similar or identical structures structural elements, provide a better understanding of the nature and advantages of the present invention.

Figure 5:
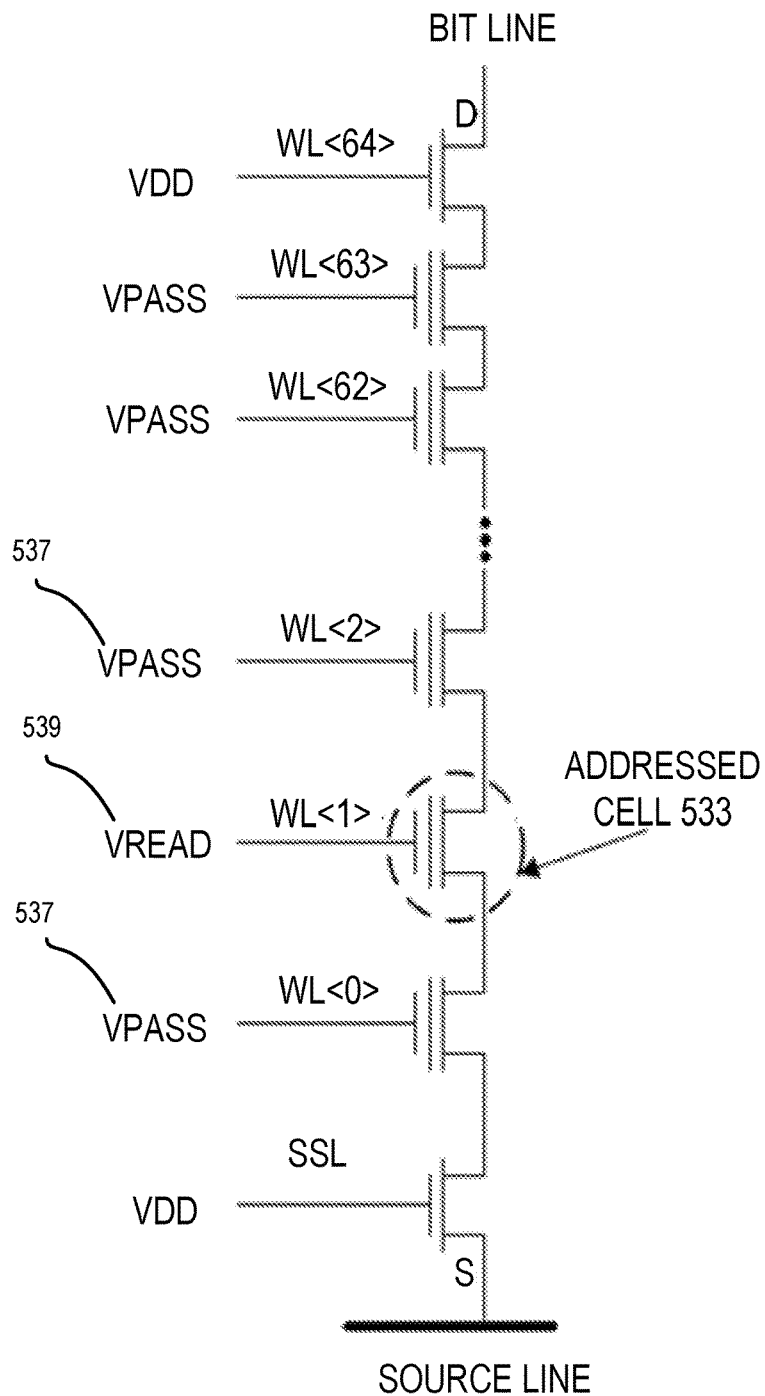
FIG. 5 illustrates a plurality of transistors arranged as memory cells of a memory system.

Memory systems utilizing NAND flash memory systems can employ single level cell (SLC) architectures, multi-level cell (MLC) architectures, and tri-level cells (TLC). When MLC and TLC architectures are utilized, the voltages representing different states become closer together. These closer voltages have been documented to contribute to an undesirable phenomenon called "read disturb" in which the voltage on a memory cell being read may be affected by neighboring memory cells. Consequently, the data read out from the memory cell is compromised when the read-out voltage indicates a data value that is different than the data value that was written to the cell. To illustrate a particular example, FIG. 5 illustrates a plurality of transistors arranged as memory cells of a memory system. When memory cell 533 is read by sampling the voltage VREAD 539, the pass voltages VPASS 537 on neighboring word lines (WL<0> and WL<2>) may adversely affect (e.g. weak programming) VREAD 539. Neighboring cells may have the largest negative impact since the weak programming may be attributable to capacitive coupling between neighboring cells.

Conventional attempts to address the problem of read disturb have focused on circuit level modifications to reduce capacitive coupling between memory cells, for example. Reducing the pass voltage applied to unselected memory cells has also been proposed to reduce the odds of the pass voltage affecting the states of neighboring memory cells. However, these solutions may be costly to implement and can add complications to reading and writing data to memory cells.

Figure 6:
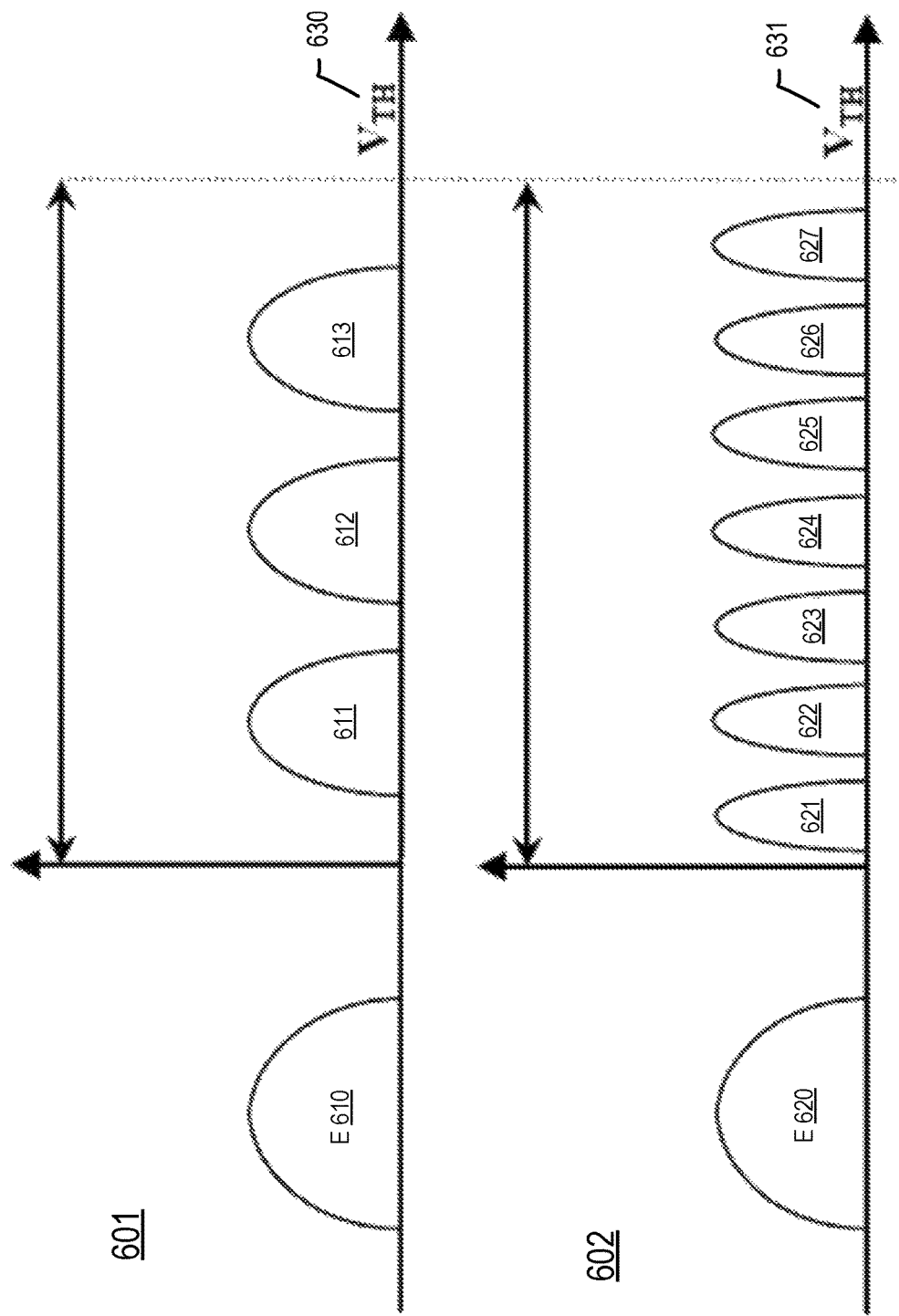
FIG. 6 illustrates a first and second chart illustrating states corresponding with a multi-level cell and a tri-level cell, respectively.
Figure 7:
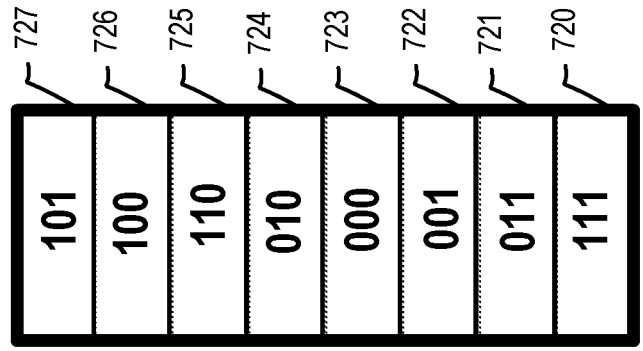
FIG. 7 illustrates digital values associated with single level cells, multi-level cells, and tri-level cells, respectively.
Figure 7:
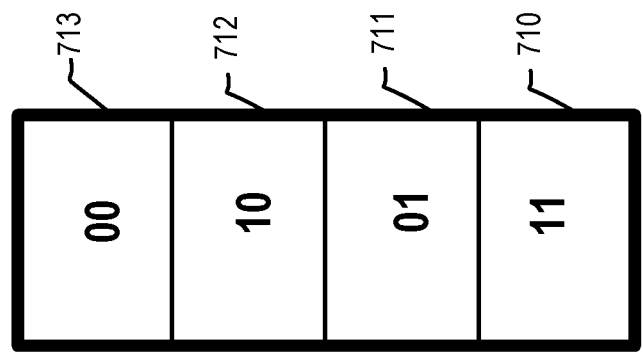
Figure 7:
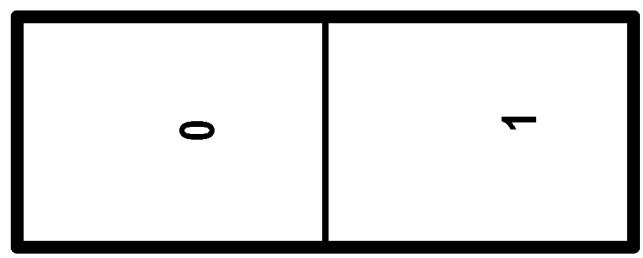

Applicant's research indicates that different voltage states react differently to read disturb and certain states are more vulnerable to the read disturb effect. One particular finding indicates that read disturb is most acute when the memory cell is at the highest voltage state (e.g. 4V) or the lowest voltage state (e.g. 0V). In chart 601 of FIG. 6, state 610 is the erase state of a MLC cell and at the lowest voltage state. Conversely, state 613 is at the highest voltage state (corresponding to threshold voltage $V_{TH}$ 630) of an MLC cell. The erase state 610 corresponds to bit pattern 710 of MLC 701 in FIG. 7 and the highest voltage state 613 corresponds with bit pattern 713 in FIG. 7. Similarly, state 611 is the voltage state corresponding to bit pattern 711 and state 612 corresponds to bit pattern 712. In chart 602 of FIG. 6, state 620 is the erase state of a TLC cell and at the lowest voltage state. Conversely, state 627 is at the highest voltage state (corresponding to threshold voltage $V_{TH}$ 631) of a TLC cell. The erase state 620 corresponds to bit pattern 720 in TLC 702 in FIG. 7 and the highest voltage state 627 corresponds with bit pattern 727 in FIG. 7. Similarly, state 621 is the voltage state corresponding to bit pattern 721, state 622 is the voltage state corresponding to bit pattern 722, state 623 is the voltage state corresponding to bit pattern 723, state 624 is the voltage state corresponding to bit pattern 724, state 625 is the voltage state corresponding to bit pattern 725, and state 626 is the voltage state corresponding to bit pattern 726.

The highest voltage state (e.g. 613 or 627) is susceptible to dropping down to the next highest state (e.g. 612 or 626) during a read disturb. Similarly, the lowest voltage state (e.g. 610 or 620) is susceptible to rising up to the second lowest state (e.g. 611 or 621), thereby corrupting the read data value.

For the purposes of this disclosure, the lowest voltage state and highest voltage state of a memory cell will be referred to as "boundary states" or "boundary voltage states" and voltage states that are not boundary states will be referred to as "non-boundary states." Similarly, bit patterns (e.g. bit patterns 710, 713, 720, and 727) that will be represented in memory by boundary voltage states may be referred to as "boundary bit patterns" and bit patterns (e.g. 711, 712, and 721-726) that will not be represented in memory as boundary voltage states may be referred to as "non-boundary bit patterns."

To reduce the read disturb phenomenon, this disclosure describes including a data modulator in a memory system. The data modulator modifies some (or all) of the data being written to a memory array to decrease the boundary voltage states being written to the memory array. A data demodulator may be also included in the memory system that translates the modified data that was written to the memory array back into the original data that was written. By altering/modulating the data strings or bit patterns that are written to memory by reducing the boundary states written to memory, read disturb effects that generate erroneous or corrupt data can also be reduced.

In FIG. 1, computing system 100 includes a host 110, memory controller 120, and memory array 130. Memory system 150 includes memory controller 120 and memory array 130. Host 110 may be a processor, microprocessor, field programmable gate array (FPGA), or other processing logic utilizing a memory system. Host 110 may write original data 113 to memory system 150 for storage. Data 113 may be sent over a bus 115. Bus 115 may be a Peripheral Component Interconnect bus in some implementations. In one implementation, memory system 150 is included in the same physical computer (e.g. laptop, desktop, smartphone, tablet) as host 110. In one implementation, memory system 150 is a thumb drive configured to be connected to a port of a computing system. In this implementation, bus 115 may be a Universal Serial Bus (USB).

Data modulator 121 generates output data 123 in response to receiving original data 113. Although not illustrated, memory controller may include intermediary modules/hardware between data modulator 121 and host 110. For example, a bus interface or bus translator may be included in memory controller 120. Output data 123 is written to memory array 130 by memory controller 120. Output data 123 may be a modified version of original data 113. The modified version of original data 113 may reduce the possibility of read disturb by reducing the number of boundary states associated with the modified data. Memory array 130 is NAND flash memory in some examples. Memory array 130 may include Megabytes of Gigabytes of memory, in some examples. Memory array 130 may include memory cells utilizing MLC architectures or TLC architectures.

Host 110 may initiate a read request to read one or more of the memory locations in memory array 130. Host 110 may initiate this read request over bus 115. In response to the read request, memory controller 120 will retrieve the data 133 that was written to the one or more memory locations. If the data 133 was modified by data modulator 121, data demodulator 129 will translate the modified data back into the original data 143 and provides original data 143 to the host. If the data was not modified by data modulator 121, (the data that is in the memory location is the same as original data 113), then data demodulator 129 simply provides the data 133 to host 110 as original data 143.

Figure 2:
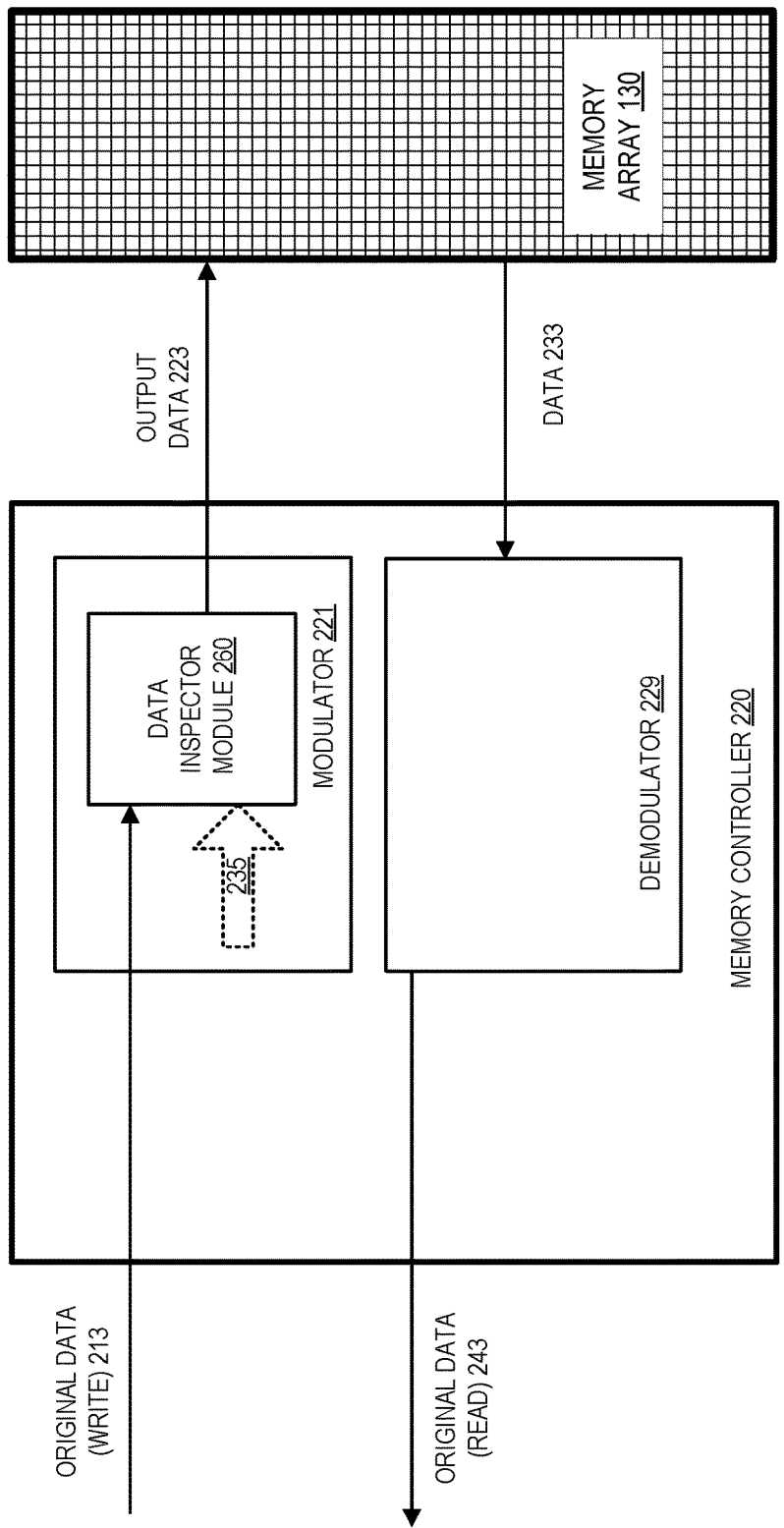
FIG. 2 illustrates an example memory system including a memory controller including a data inspector module.

FIG. 2 illustrates an example memory system 250 that is an example of memory system 150. Memory system 250 includes a memory controller 220 and memory array 130. Memory controller 220 includes a data modulator 221 and a data demodulator 229. Data modulator 221 includes a data inspector module 260. Data inspector module 260 performs a conversion operation that selectively modulates incoming data 213 when incoming data 213 has a data bit patterns that will have too many boundary states. Data inspector module 260 counts the boundary bit patterns in the original incoming data 213 and compares the boundary bit pattern count to a threshold level. When the boundary bit pattern count is above the threshold level, the original data is modulated into modified data by reducing the number of boundary bit patterns in the original data to below the threshold level. To illustrate, a page of memory locations is written to memory array 130. The threshold level may be 30%, 50%, or 70% of the memory cells of the page having boundary states, for example. In other words, if a certain percentage (the threshold level) of the bit patterns in the unit of data that is written to memory array 130 includes boundary bit patterns, data inspector module 260 will modify that unit of the original data 213 to reduce the number of boundary bit patterns and thus reduce the likelihood of causing a read disturb when the modified data is read from the memory array 130. Original data 213 that has a number of boundary bit patterns that are below the threshold level may be retained and simply passed (without modification) by data inspector module 260 and written to memory array 130 as original data.

Data inspector module 260 is optionally configured to receive a Program/Erase Cycle Count 235 of memory array 130. Memory controller 220 may keep track of the number of program and erase operations of memory array 130 as it relates to the useful life of memory array 130. In some NAND flash memory systems, data corruption corresponding to physical deterioration of the flash memory manifests after a certain number of writes (e.g. 5000) to the flash memory. Data inspector module 260 may adjust its threshold level depending on what the Program/Erase cycle count 235 is. For example, the threshold level may decrease as the cycle count rises since an increased cycle count 235 may indicate that the NAND flash memory system is more susceptible to read disturb, which may be attributable to a physical deterioration of the NAND flash memory itself because of the cycle counts 235.

When memory controller 220 receives a read request, data demodulator 229 retrieves the data 223 from the memory location of memory array 130. If the memory location includes modified data, data demodulator 229 will translate the modified data back the original data. Data inspector module 260 may record which memory locations of memory array 130 include modified data and data demodulator 229 may access that record to determine if a data 233 from certain memory locations need to be translated back to the original data 243, which is the same original data 213 that was sent to memory controller 220. If the data 233 from the read memory location is original data (data modulator 221 did not translate to modified data), then data demodulator does not need to translate it, but rather passes the data 233 through as original data 243.

Figure 3:
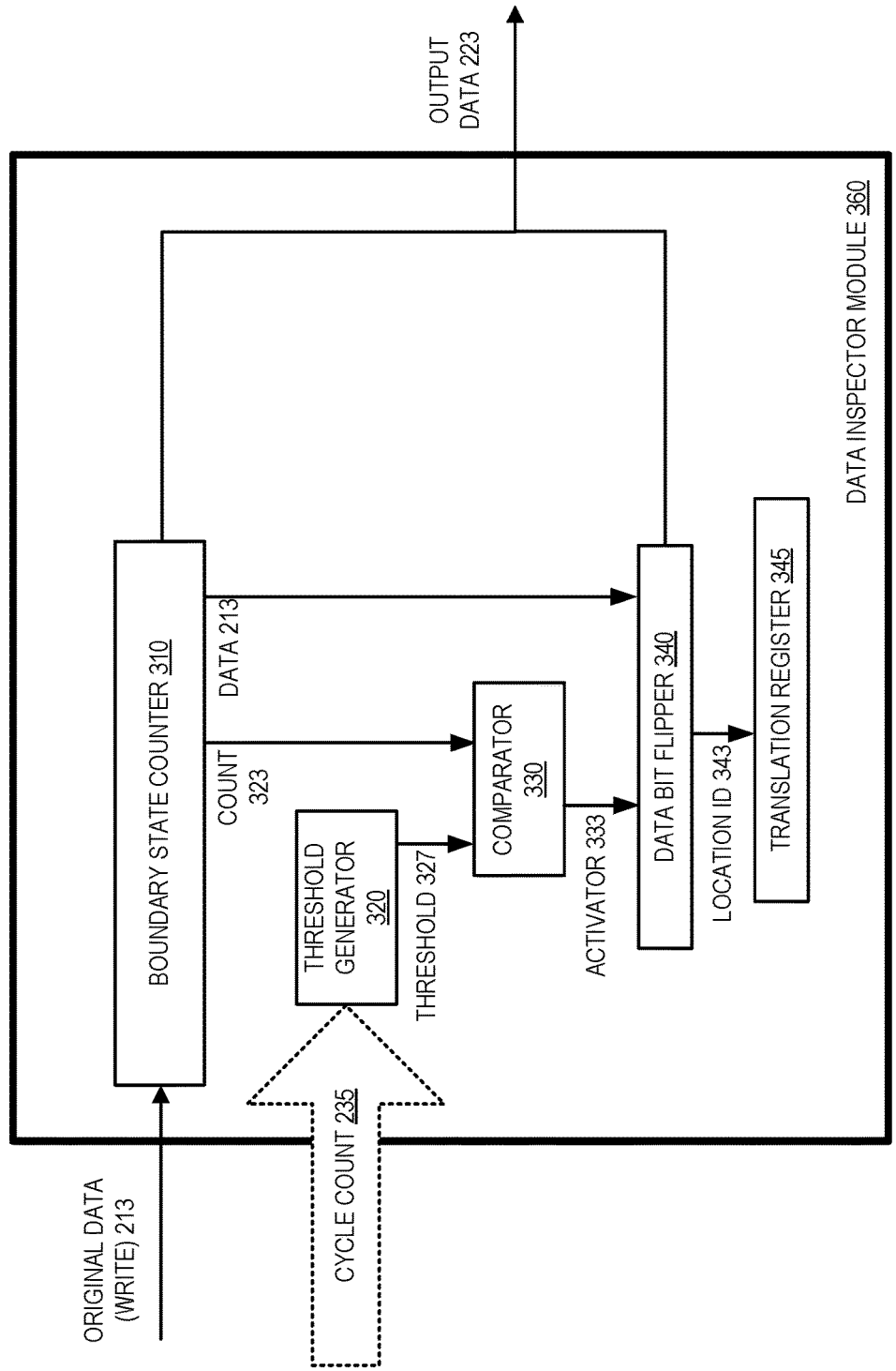
FIG. 3 illustrates an example data inspector module.

FIG. 3 illustrates an example data inspector module 360 that is one example of data inspector module 260. In FIG. 3, boundary state counter 310 receives original data 213. Boundary state counter 310 may look at data bit patterns of the original data 213 to determine how many boundary states are included in original data 213. For example, when memory array 130 utilizes an MLC architecture, a bit pattern 710 of 11 or a bit pattern 713 of 00 will increment the boundary state count since they correspond with a lowest and highest voltage state of an MLC. When memory array 130 utilizes a TLC architecture, a bit pattern 720 of 111 or a bit pattern 727 of 101 will increment the boundary state count since they correspond with a lowest and highest voltage state of a TLC. The boundary count 323 and the data 213 are illustrated as outputs of boundary state counter 310, in FIG. 3.

Threshold generator 320 receives Program/Erase cycle count 235, in FIG. 3. Threshold generator 320 accesses a lookup table to determine what threshold 327 to generate in response to receiving cycle count 335, in one example. In one implementation, threshold generator 320 outputs threshold 327 using a formula that includes cycle count 235 as an input variable. Comparator 330 receives threshold 327 and boundary count 323. If the boundary count is greater than the threshold 327, then comparator 330 asserts an activator signal 333. When activator signal 333 is asserted, data 213 has more boundary states than the allowed threshold. Therefore, data 213 will be modified to reduce the boundary states. Data bit flipper 340 may reduce the bit patterns of data 213 that will generate boundary states by changing bit patterns 710 and 720 to bit patterns 711 and 721, respectively. Data bit flipper 340 may also change bit patterns 713 and 727 to bit patterns 712 and 726, respectively, so that the bit patterns don't correspond to boundary states. When data bit flipper 340 receives an asserted activator signal 333, data bit flipper 340 alters data 213 to reduce the boundary states that will need to be written to memory array 130. Data bit flipper 340 may store a location identification 343 (e.g. a pointer) to translation registers 345 that identifies the memory location of memory array 130 that modify data is stored to. Data demodulator 229 can then access translation registers 345 to determine what memory locations include modified data and to translate the modified data back to the original data 243. If data bit flipper 340 modifies data 213 (when activator 333 is asserted), output data 223 is modified data. When the original data 213 does not include enough bit patterns that will generate boundary states, boundary state counter 310 may simply output the original data 213 as output data 223. Therefore, output data 223 can be the original data 213 or modified data.

Figure 4:
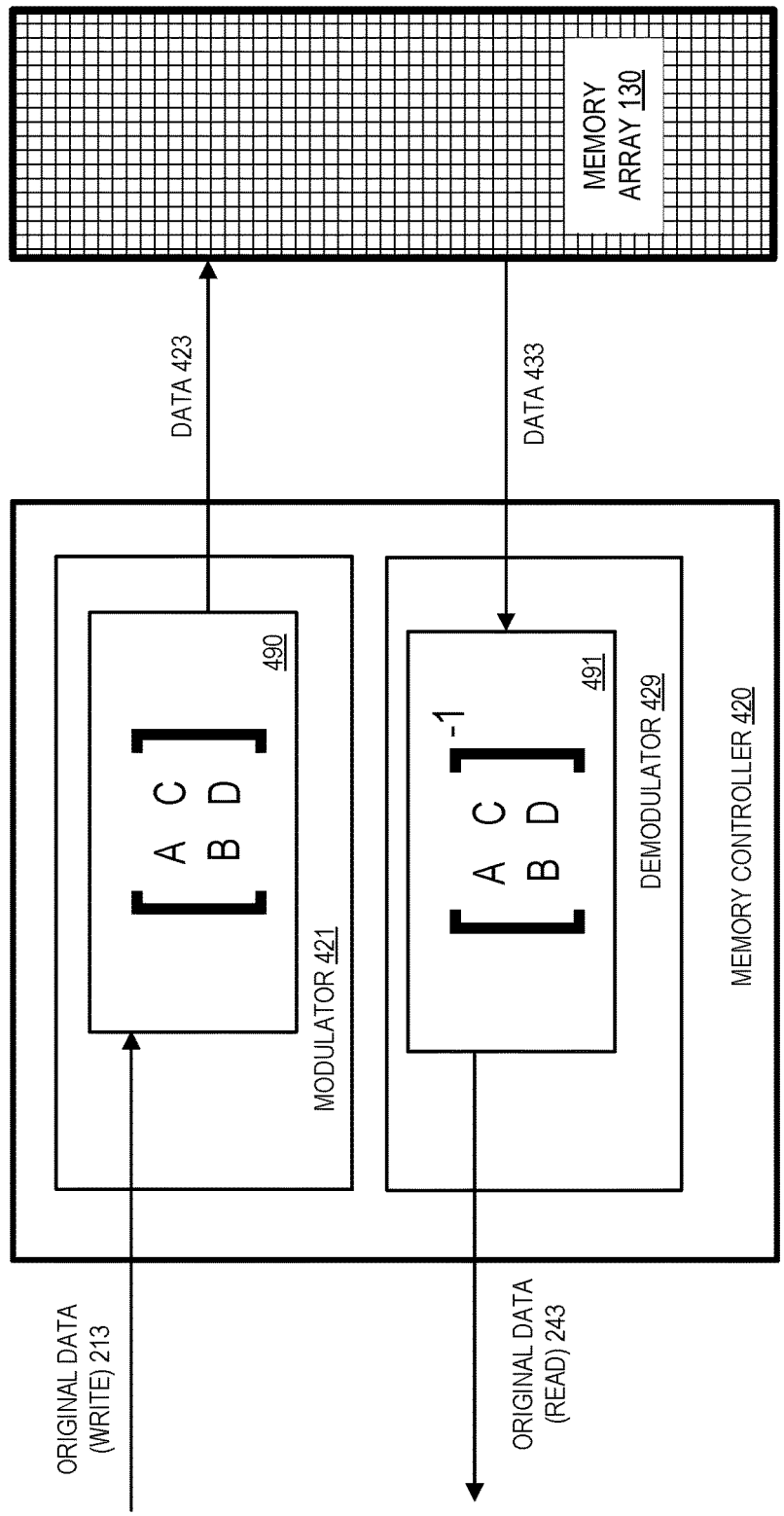
FIG. 4 illustrates an example memory controller including a data modulator configured to apply a matrix to data.

FIG. 4 illustrates an example memory controller 420 that includes a data modulator 421 and a data demodulator 429. Data modulator 421 applies a conversion function to all incoming data 213. In FIG. 4, data modulator 421 applies a conversion matrix 490 as the conversion function to all incoming data 213. Data demodulator 429 applies an inverse conversion function to data 433 that is read from a memory location of memory array 130. In FIG. 4, data demodulator 429 applies the inverse conversion matrix 491, which is the inverse of conversion matrix 490. Conversion matrix 490 is configured to generate output data 423 that has an acceptably even distribution of bit patterns that generate boundary states when written to memory array 130. If data 213 received by data modulator 421 has a very high percentage (e.g. greater than 70%) of bit patterns that will generate boundary states, conversion matrix 490 may output data 423 with fewer boundary states. Using computer programs, conversion matrix 490 may be calculated and tuned to transform the incoming bit pattern into a more read-disturbed-favored pattern, which has an acceptable percentage of boundary states. The acceptable percentage of boundary states prevents writing data to memory array 130 with a high percentage of boundary states (e.g. more than 50%). The computer programs used to tune the conversion matrix 490 may be used for similar purposes in the cryptology context, for example.

Generating a read-disturb-favored pattern may include utilizing a conversion matrix that, when applied to a unit (e.g. page) of data, will on average, generate bit patterns that are distributed across voltage states of the memory cells. Therefore, this conversion matrix serves to reduce the boundary voltage states of a data unit that includes a high percentage of boundary voltage states by spreading the high percentage of boundary states across voltage states of a memory cell. Applying the conversion matrix may actually increase the total number of boundary voltage states in some data units, however, read disturb is most frequent when there is a high concentration of boundary states, so reducing high concentrations of boundary states at the cost of slightly increasing low concentrations of boundary states in a data unit may be an acceptable tradeoff.

Data demodulator 429 retrieves data 433 from memory locations of memory array 130 in response to a read request. The inverse conversion matrix 491 is applied to data 433 to recover the original data 243, which is the same as original data 213.

Figure 8:
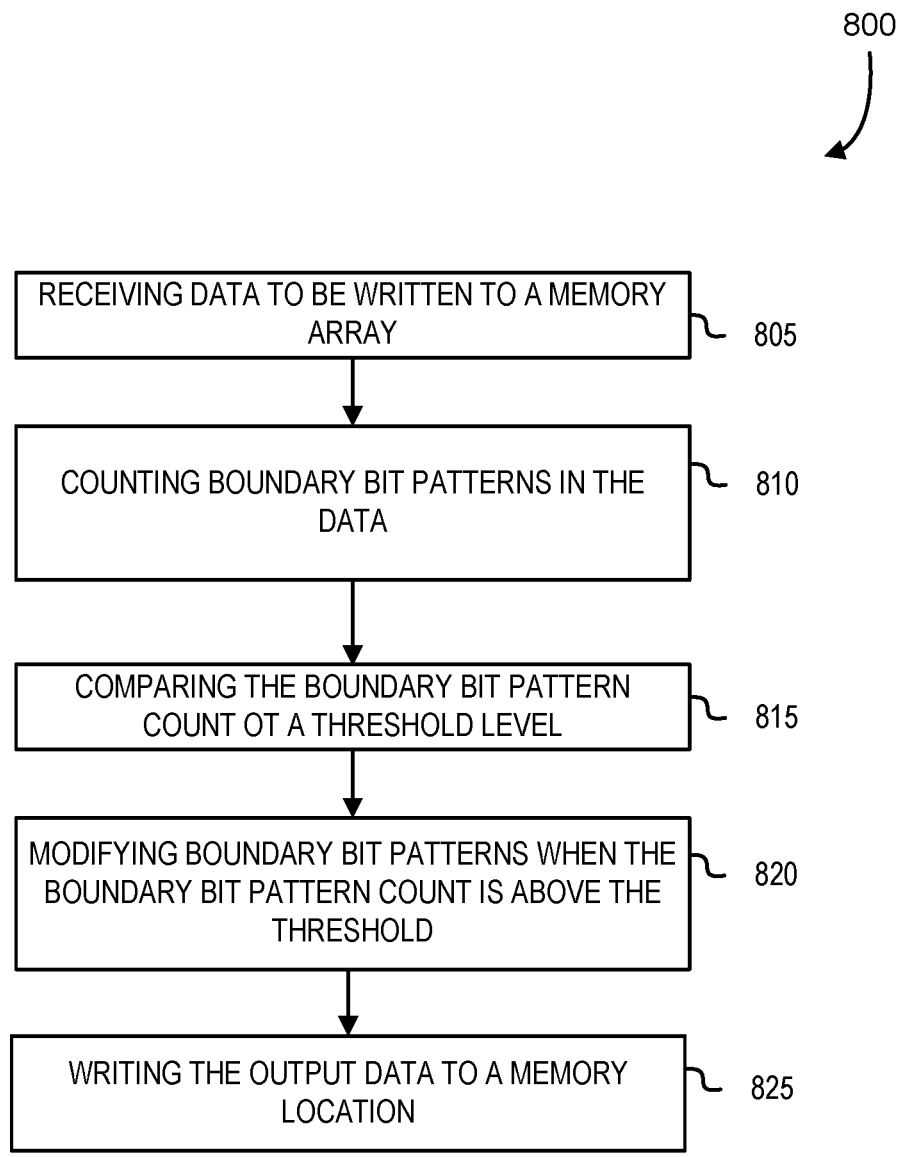
FIG. 8 illustrates a method of reducing read disturbs in memory cells.

FIG. 8 illustrates an example of a process 800 of reducing read disturbs in memory locations. Memory controller 220 may execute process 800, for example. The process 800 is illustrated as a logical flow diagram, each operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be omitted or combined in any order and/or in parallel to implement this process and any other processes described herein.

Some or all of the process 800 (or any other processes described herein, or variations and/or combinations thereof) may be performed under the control of one or more computer systems configured with executable instructions and may be implemented as code (e.g., executable instructions, one or more computer programs or one or more applications). The code may be stored on a computer-readable storage medium, for example, in the form of a computer program including a plurality of instructions executable by one or more processors. The computer-readable storage medium may be non-transitory.

In process block 805, data (e.g. data 213) is received to be written to a memory array (e.g. memory array 130). In process block 810, boundary bit patterns in the data are counted. The boundary bit patterns correspond to the highest and lowest voltage levels in a memory cell. For example, in an MLC architecture, bit patterns 710 and 713 are boundary bit patterns because they correspond with erase state 610 (lowest voltage level) and state 613 (highest voltage level). In a TLC architecture, bit patterns 720 and 727 are boundary bit patterns because they correspond with erase state 620 (lowest voltage level) and state 627 (highest voltage level).

In process block 815, the boundary bit pattern count is compared, by a comparator, to a threshold level (e.g. threshold level 327). In process block 820, boundary bit patterns of the data are modified when the boundary bit pattern count of the data is above the threshold. The boundary bit patterns may be modified by data bit flipper 340, for example. In process block 825, the output data is written to a memory location of the memory array. The output data may be modified (when boundary bit patterns of the data are over the threshold) or the unmodified original data (when the boundary bit patterns of the data are not over the threshold).

The output data written to the memory array may be retrieved by a data demodulator (e.g. 229) in response to a read request that addresses a particular memory location of the memory array. If the data was modified, the data demodulator will translate the read data back to the original data by demodulating the portion of the data that was modified. If the read data was not modified (it was original), then data demodulator simply passes the data to whatever entity (e.g. host 110) that made the read request. The data demodulator may consult registers (e.g. register 345) or a table stored in a memory to determine whether the data that is being read from the memory array is modified data or original data.

Figure 9:
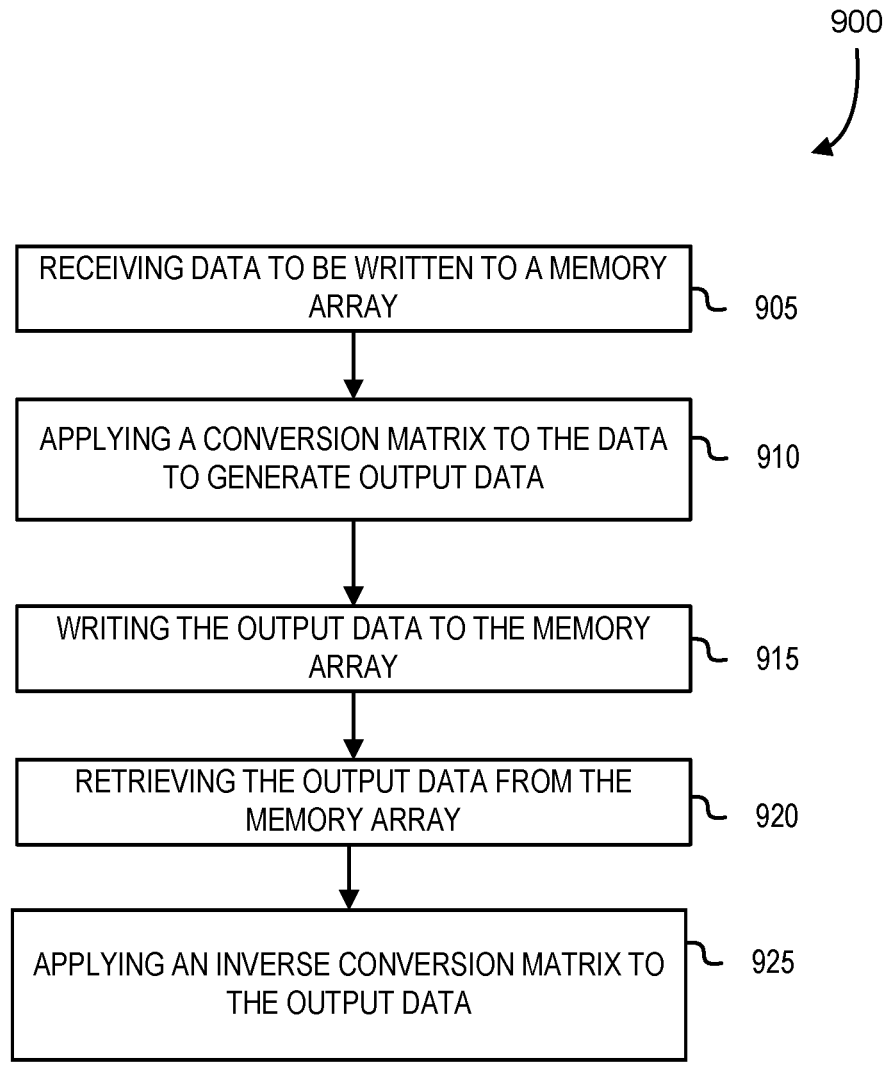
FIG. 9 illustrates a method of reducing read disturbs in memory cells.

FIG. 9 illustrates an example of a process 900 of reducing read disturbs in memory locations. Memory controller 420 may execute process 900, for example. The process 900 is illustrated as a logical flow diagram, each operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be omitted or combined in any order and/or in parallel to implement this process and any other processes described herein.

Some or all of the process 900 (or any other processes described herein, or variations and/or combinations thereof) may be performed under the control of one or more computer systems configured with executable instructions and may be implemented as code (e.g., executable instructions, one or more computer programs or one or more applications). The code may be stored on a computer-readable storage medium, for example, in the form of a computer program including a plurality of instructions executable by one or more processors. The computer-readable storage medium may be non-transitory.

In process block 905, data (e.g. data 213) is received to be written to a memory array (e.g. memory array 130). A conversion matrix is applied to the data to generate output data in process block 910. The conversion matrix is configured to provide the output data with an acceptably even distribution of voltage states of a memory cell, when the output data is written to the memory cell. In process block 915, the output data is written to the memory array. In process block 920, the output data is retrieved from the memory array. An inverse of the conversion matrix applied in process block 910 is applied to the output data in process block 925. Applying the inverse conversion matrix converts the output data back to the original data that was written to the memory array. The original data may be provided to an entity (e.g. host 110) that made a read request to read the data from the memory array.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A memory system comprising:
   an array of memory locations;
   a memory controller including a processor, configured to execute instructions comprising a functionality of:
   a data modulator to:
     generate a count of boundary bit patterns in original data, wherein the boundary bit patterns correspond to a highest voltage level and a lowest voltage level in a memory cell of a memory location in the array of memory locations;
     compare, with a comparator of the data modulator, the count of the boundary bit patterns to a threshold level;
     based on the count of the boundary bit pattern being above the threshold level, translate the original data into modified data according to a conversion operation, wherein the conversion operation includes applying a conversion function to all original data received by the data modulator, the conversion function configured to generate the modified data with distributed states reducing a number of the boundary bit patterns of the original data; and
     write the modified data to the array of memory locations, wherein the modified data generated by the conversion operation reduces a probability of the original data suffering a read disturb in the array of memory locations.

2. The memory system of claim 1, further comprising
   a data demodulator to receive a read request, and in response to the read request, is configured to:
     retrieve the modified data from the array of memory locations; and
     translate the modified data back into the original data.

3. The memory system of claim 1, wherein the data modulator passes the original data when the count of the boundary bit patterns is not above the threshold level and the memory controller writes the original data to a memory location in the array of memory locations.

4. The memory system of claim 1, wherein translating the modified data back to the original data includes demodulating portion of the modified data that was modulated.

5. The memory system of claim 1, wherein the threshold level is received from a threshold generator of the data modulator, the threshold generator receiving a cycle count indicating a number of program and erase cycles of the array of memory locations, and wherein the threshold generator decreases the threshold level as the number of program and erase cycles of the array of memory locations increases.

6. The memory system of claim 1, wherein the data modulator includes translation registers that store a list of the memory locations that include the modified data.

7. The memory system of claim 1, wherein translating the modified data back to the original data includes applying an inverse of the conversion function.

8. The memory system of claim 1, wherein the original data is processed in page units of the array of memory locations.

9. The memory system of claim 8, wherein the array of memory locations is an array of Not AND (NAND) flash memory locations.

10. A method comprising:
    receiving data to be written to an array of memory locations;
    generating a count by counting boundary bit patterns in the data, wherein the boundary bit patterns correspond to a highest voltage level and a lowest voltage level in a memory cell of the memory locations;
    comparing, with a comparator, the count of the boundary bit patterns to a threshold level;
    passing the data as output data when the count of the boundary bit patterns is below the threshold level;
    generating modified data as the output data by modulating at least a portion of the boundary bit patterns of the data to non-boundary bit patterns when the count of the boundary bit patterns is above the threshold level; and
    writing the output data to a memory location among the array of memory locations.

11. The method of claim 10, wherein the threshold level is generated using a number of program and erase cycles of the array of memory locations, and wherein the threshold level is reduced as the number of program and erase cycles of the array of memory locations increases.

12. The method of claim 10 further comprising:
    retrieving the modified data from the memory location in response to a read request of the memory location;
    demodulating the portion of the modified data that was modulated to generate the data that was originally received; and
    providing the data to a host that initiated the read request.

13. The method of claim 12 further comprising:
    recording an indication that the modified data was written to the memory location; and
    accessing the indication and demodulating the portion of the modified data in response to the indication indicating that the memory location includes the modified data.

14. The method of claim 10, wherein the array of memory locations is an array of Not AND (NAND) flash memory locations.

* * * * *